United States Patent
Jung et al.

(10) Patent No.: US 9,293,159 B2
(45) Date of Patent: Mar. 22, 2016

(54) POSITIVE AND NEGATIVE MAGNETOSTRICTION ULTRAHIGH LINEAR DENSITY SENSOR

(71) Applicant: Seagate Technology LLC, Cupertino, CA (US)

(72) Inventors: Wonjoon Jung, Eden Prairie, MN (US); Dimitar V. Dimitrov, Edina, MN (US); Mark T. Kief, Lakeville, MN (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 14/610,771

(22) Filed: Jan. 30, 2015

(65) Prior Publication Data

US 2015/0221326 A1    Aug. 6, 2015

Related U.S. Application Data

(60) Provisional application No. 61/934,068, filed on Jan. 31, 2014.

(51) Int. Cl.
*G11B 5/39* (2006.01)
*G11B 5/33* (2006.01)
*G11B 5/31* (2006.01)

(52) U.S. Cl.
CPC .............. *G11B 5/332* (2013.01); *G11B 5/315* (2013.01); *G11B 5/39* (2013.01); *G11B 5/3906* (2013.01)

(58) Field of Classification Search
CPC ...... G11B 5/39; G11B 5/3903; G11B 5/3909; G11B 5/3912; G11B 2005/3996; G11B 5/3906
USPC .......... 360/324.1, 324.11, 324.12, 324.2, 322
See application file for complete search history.

(56) References Cited

U.S. PATENT DOCUMENTS

| | | | |
|---|---|---|---|
| 7,751,156 B2 | 7/2010 | Mauri et al. | |
| 8,194,365 B1 | 6/2012 | Leng et al. | |
| 8,427,791 B2 | 4/2013 | Gao et al. | |
| 8,498,084 B1 | 7/2013 | Leng et al. | |
| 8,559,141 B1 | 10/2013 | Pakala et al. | |
| 8,947,835 B2 * | 2/2015 | Lin | 360/324.12 |
| 9,040,178 B2 * | 5/2015 | Zhao et al. | 428/811.1 |
| 2002/0126427 A1 * | 9/2002 | Gill | B82Y 10/00 360/324.12 |
| 2004/0252416 A1 * | 12/2004 | Horng et al. | 360/324.1 |
| 2005/0024785 A1 * | 2/2005 | Gill | G11B 5/3932 360/323 |
| 2005/0195534 A1 | 9/2005 | Gill | |
| 2006/0128038 A1 | 6/2006 | Pakala et al. | |
| 2010/0073828 A1 * | 3/2010 | Wang et al. | 360/324.12 |
| 2010/0177449 A1 * | 7/2010 | Zhao et al. | 360/324.12 |
| 2012/0127603 A1 | 5/2012 | Gao et al. | |

\* cited by examiner

*Primary Examiner* — Jefferson Evans
(74) *Attorney, Agent, or Firm* — Hall Estill Attorneys at Law

(57) ABSTRACT

A data sensor may be configured with a magnetic stack disposed between first and second magnetic shields. The magnetic stack can have a non-magnetic spacer layer disposed between first and second magnetically free laminations respectively coupled to the first and second magnetic shields via first and second electrode laminations. The first magnetically free lamination may have a first sub-layer constructed of a transition metal material and disposed between a second sub-layer constructed of a negative magnetostriction material and a third sub-layer constructed of a positive magnetostriction material.

20 Claims, 5 Drawing Sheets

POSITIVE AND NEGATIVE MAGNETOSTRICTION ULTRAHIGH LINEAR DENSITY SENSOR

SUMMARY

A data sensor, in accordance with assorted embodiments, has a magnetic stack disposed between first and second magnetic shields. The magnetic stack has a non-magnetic spacer layer disposed between first and second magnetically free laminations respectively coupled to the first and second magnetic shields via first and second electrode laminations. The first magnetically free lamination has a first sub-layer constructed of a transition metal material and disposed between a second sub-layer constructed of a negative magnetostriction material and a third sub-layer constructed of a positive magnetostriction material.

DETAILED DESCRIPTION

Industry interest in reduced form factor data storage devices with higher data storage capacity and data access rates has continually increased and consequently emphasized the physical size and magnetic stability of various data storage components. For example, a data sensor with reduced physical dimensions can lack magnetic and magneto-elastic properties to provide magneto-electrical performance suitable for increased linear data bit densities present on rotating data storage media.

While data sensing laminations with reduced physical dimensions can theoretically access data bits with increased linear density, manufacturing and operational variables, such as process variations and heat, can present magnetic stability issues that jeopardize the accuracy and speed of data sensing. Hence, there is continued interest in a data sensor with reduced physical size that exhibits robust magnetic stability capable of optimized performance in ultrahigh linear data bit density data storage environments.

Accordingly, a data sensor is configured with a magnetic stack disposed between first and second magnetic shields with the magnetic stack having a non-magnetic spacer layer disposed between first and second magnetically free laminations respectively coupled to the first and second magnetic shields via first and second electrode laminations. The first magnetically free lamination may have a first sub-layer constructed of a transition metal material and disposed between a second sub-layer constructed of a negative magnetostriction material and a third sub-layer constructed of a positive magnetostriction material. The ability to tune the material and thicknesses of the various magnetic stack laminations can provide a predetermined interface texture that promotes high performance magnetoresistance in the magnetic stack. Tuning the coupling strength between a magnetically free layer and the magnetic shield via coupling and magnetic seed laminations further provides the ability to optimize data sensor magnetic stability and performance.

Figure 1:
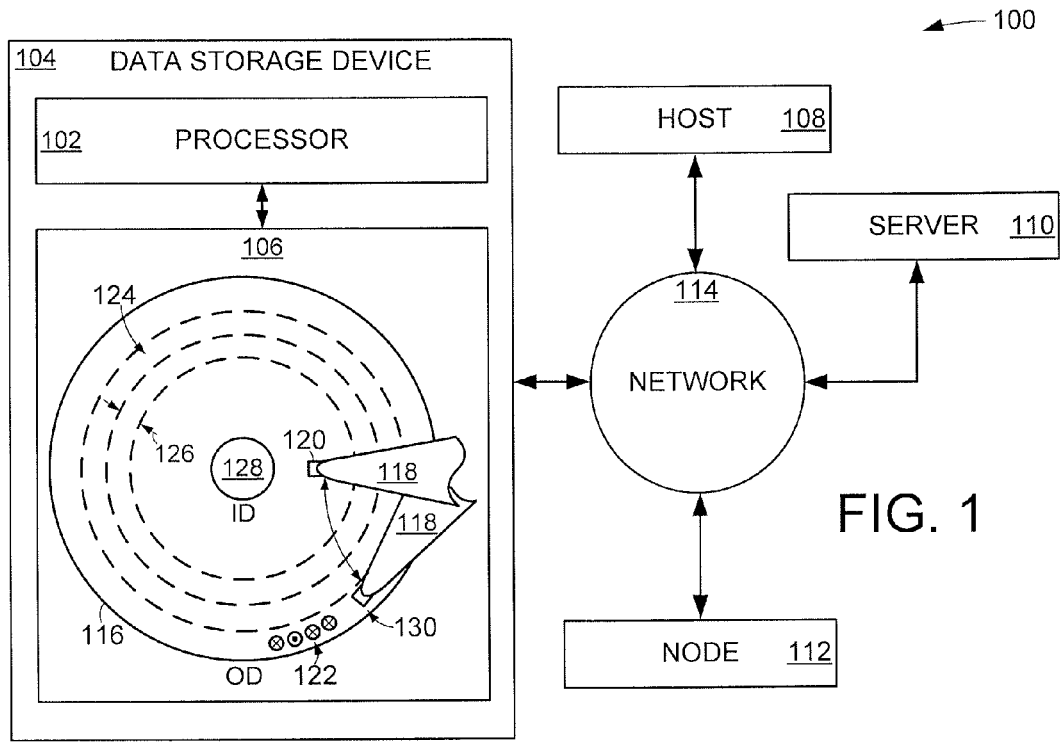
FIG. 1 is a block representation of an example portion of a data storage device configured and operated in accordance with some embodiments.

FIG. 1 illustrates a block representation of portions of an example data storage system 100 capable of employing a tuned magnetic stack in accordance with various embodiments. It should be noted that construction and operation of a tuned data sensor may be implemented into an unlimited variety of data storage environments, without limitation. The data storage system 100 is configured with a local processor 102 that may be resident in a data storage device 104 to direct data access activities to and from at least one data storage assembly 106, which is partially illustrated as a top view block representation in FIG. 1.

Access to the data storage assembly 106 may further be provided to a plurality of remote hosts 108, servers 110, and nodes 112 via wired and wireless networks 114. Through appropriate network protocol, the network 114 can allow successive and concurrent interaction between the local data storage device 104 and remote features to temporarily and permanently store data to one or more data storage media 116 of the data storage assembly 106. While not required or limiting, the data storage assembly 106 may have at least one actuating assembly 118 that is capable of positioning a transducing head 120 over a variety of locations on the magnetic storage media 116 where stored data bits 122 are located on predetermined data tracks 124.

In an effort to elevate data storage capacity, data bits may be positioned with increased linear density along each data track 124. That is, the data bit areal density of the data storage media 116 may be increased by positioning data bits closer together along the path of each data track 124 and by formatting greater numbers of data tracks 124 with reduced widths 126. Movement of the storage media 116 can be facilitated through attachment to one or more spindle motors 128 that rotate during use to produce an air bearing surface (ABS) on which a slider portion of the actuating assembly 118 flies to position a head gimbal assembly (HGA) 130, which includes the transducing head 120, over a predetermined portion of the media 116.

The transducing head 120 can be configured with one or more transducing elements, such as a magnetic writer and magnetically responsive sensor, which operate to program and read data from the selected data tracks 124 of the storage media 116, respectively. In this way, controlled motion of the actuating assembly 118 correspond with alignment of the transducers with the data tracks 124 defined on the storage media surfaces to write, read, and rewrite data. As the data bits 122 become more densely positioned in data tracks 124 with smaller radial widths 126, the head 120 has to be responsive to smaller magnetic flux signatures with reliable accuracy, which can be problematic when the physical size of the head 120 is reduced and heat can more easily affect the magnetic stability of the constituent data sensing components.

Figures 2A, 2B, 2C:
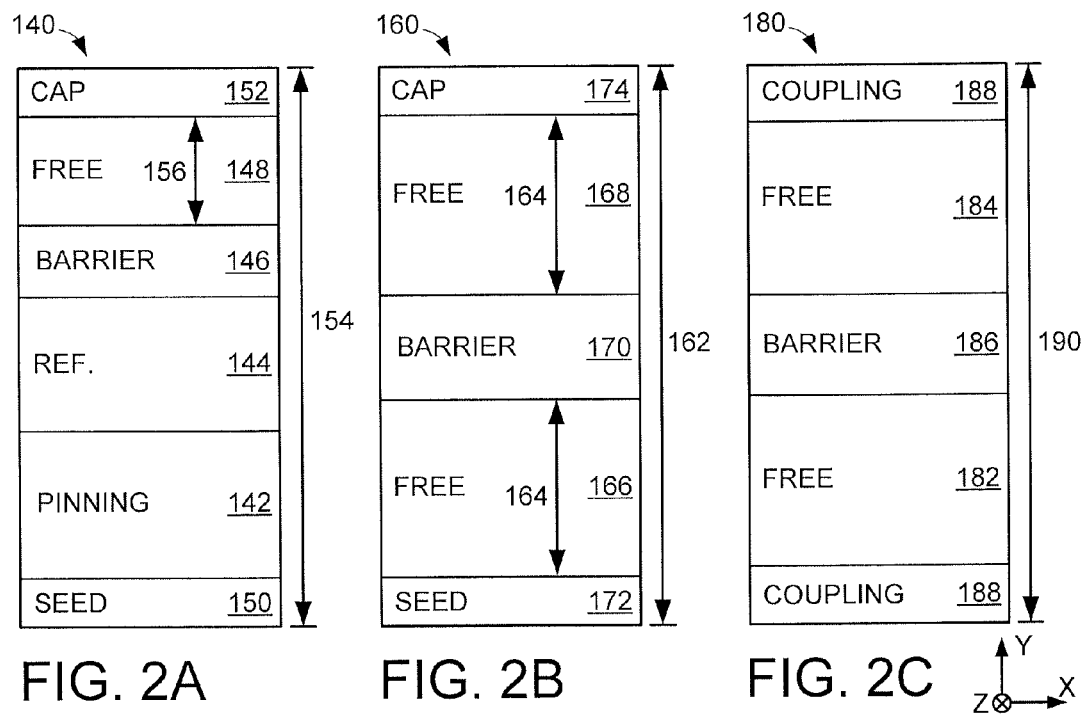
FIGS. 2A, 2B, and 2C respectively show portions of example magnetic stacks each capable of being utilized in the data storage device of FIG. 1.

FIGS. 2A, 2B, and 2C respectively display ABS view block representations of example data sensor magnetic stacks 140, 160, and 180 that may, individually and in combination, be utilized by the data storage assembly 106 of FIG. 1 in accordance with some embodiments. In FIG. 2A, magnetic stack 140 is configured as an abutted junction with a fixed magnetization pinning layer 142 contacting a fixed magnetization reference layer 144 opposite a non-magnetic barrier layer 146 from a magnetically free layer 148. The non-magnetic barrier layer 146 may, alternatively, be constructed as spacer layer of non-magnetic material, such as Cu or Ag. As the free layer 148 responds to an external data bit while the reference layer 144 maintains a fixed magnetization due to the exchange coupling with the pinning layer 142, a magnetoresistance can be induced between the free 148 and reference 144 layers that is read as a logic state.

Through various tuned configurations, seed 150 and cap 152 layers can be positioned on a single, or opposite sides of the sensor 140 to provide predetermined grain growth and magnetic properties, such as anisotropy, in the pinning layer 142. The thickness, such as free layer thickness 156, and material of various constituent layers of the abutted junction sensor 140 can provide a shield-to-shield spacing 154 that determines the magnetic extent, data bit resolution, and data track resolution of the sensor 140. However, the inclusion of the reference 144 and pinning 142 layers can correspond to a smaller free layer thickness 154, increased shield-to-shield spacing 154, and reduced magnetoresistive ratio between the free 148 and reference 144 layers.

In contrast, a trilayer data sensor, as shown as magnetic stack 160 of FIG. 2B, may be used to read data bits with a reduced shield-to-shield spacing 162 and greater free layer thickness 164 compared to the abutted junction sensor 140. The trilayer stack 160 can be constructed with first 166 and second 168 magnetically free layers that are separated by a barrier layer 170 and set to default magnetizations by biasing structures external to the trilayer stack 160. The relocation of any fixed magnetization structures from the ABS allows for the reduced magnetic stack 160 physical size 162 compared to the abutted junction sensor 140 that has a fixed magnetization structure. However, the lack of any fixed magnetization in the trilayer stack 160 can be difficult to bias properly and may exhibit increased magnetic volatility in the presence of elevated temperatures and data storage media rotational speeds present in high linear data bit density data storage environments.

FIG. 2C displays an example dual free layer magnetic stack 180 configured to provide increased magnetic stability in accordance with various embodiments. The dual free layer magnetic stack 180 has first 182 and second 184 magnetically free layers separated by a barrier layer 186, much like the trilayer stack 160 of FIG. 2C, but the free layers 182 and 184 are each magnetically coupled to adjacent shields via a magnetic coupling layer 188. Positioning a non-magnetic coupling layer 188 between each free layer 182 and 184 and the respective magnetic shields allows predetermined coupling, such as RKKY coupling, to be induced that sets the free layers 182 and 184 to predetermined default magnetizations that each respond to encountered external data bits.

Magnetic construction of the coupling layers 188 further allows the thickness of the layers, as measured along the Y axis, to be excluded from the shield-to-shield spacing 190 of the stack 180 as the coupling layers 188 each effectively act as part of the shields and not part of the magnetically sensitive extent of the stack 180. However, use of a non-magnetic coupling 188 layer can provide face centered cubic (fcc) crystallographic texture at the interface of the magnetically free layers 182 and 184 and coupling layer 188. Additionally, the coupling layer 188 can result in unstable magnetic coupling of the magnetically free layers 182 and 184 with adjacent magnetic shields, which can degrade the magnetoresistive response of the stack 180 by making default free layer magnetizations more volatile.

Figure 3:
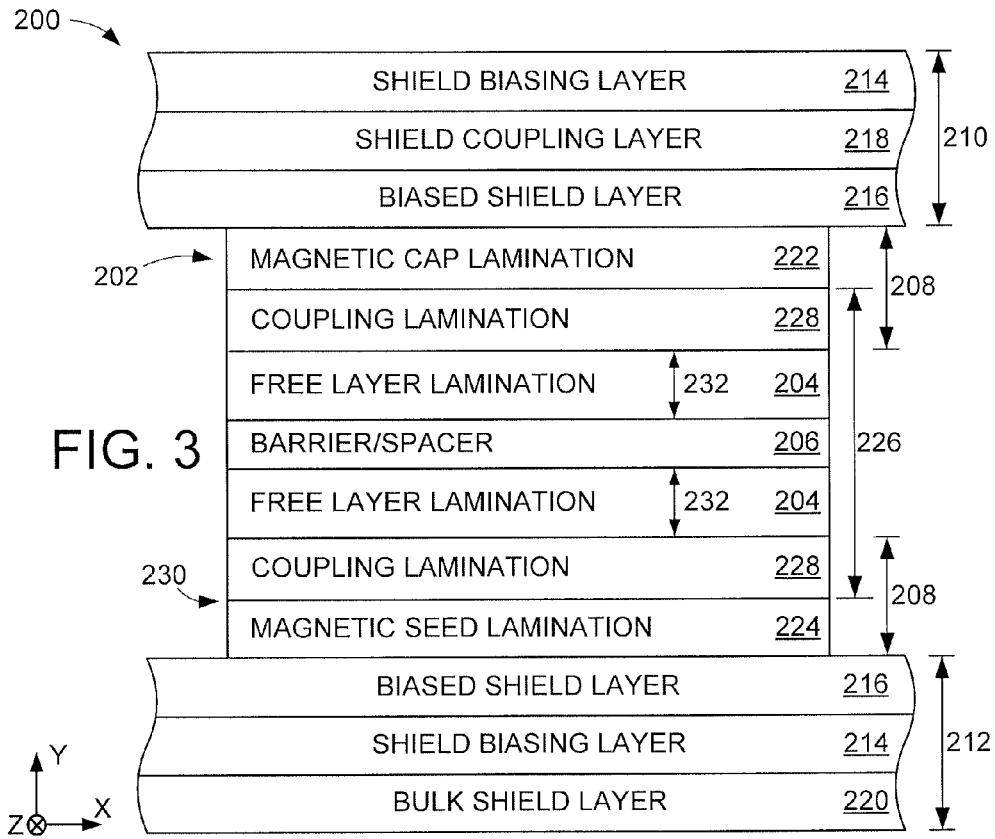
FIG. 3 displays an ABS view block representation of a portion of an example data sensor constructed in accordance with various embodiments.

It can be appreciated that the coupling of magnetically free layers to adjacent shields can reduce the shield-to-shield spacing 190, but can be susceptible to process and operational variables, like heat and stray magnetic fields from data bits, which can jeopardize the data bit sensing accuracy and performance of a data storage device. FIG. 3 shows a cross-sectional block representation of an example ultrahigh linear density data sensor 200 configured in accordance with various embodiments. The data sensor 200 has a magnetic stack 202 that consists of a barrier/spacer layer 206 separating the magnetically free layer laminations 204 and an electrode lamination 208 respectively separating the free layer laminations 204 from the top 210 and bottom 212 magnetic shields.

The magnetic shields 210 and 212 are not limited to a single layer, material, or configuration, but in some embodiments one or both shields have a shield biasing layer 214, such as antiferromagnetic layer or permanent magnet, that biases at least a biased shield layer 216 to a fixed magnetization. While not limiting, the example data sensor 200 has different top and bottom shield configurations that respectively illustrate example exchange coupled and synthetic antiferromagnetic (SAF) shield structures capable of providing a fixed shield magnetization. Top shield 210 is configured as a SAF shield where a non-magnetic shield coupling layer 218 separates the magnetic shield biasing layer 214 from the magnetic biased shield layer. The bottom shield 212 is configured as an exchange coupled shield with magnetic shield biasing layer 214 contacting the magnetic biased shield 216 and bulk shield 220 layers, which can be constructed as similar or dissimilar materials, such as NiFe and CoFe, to define the magnetic extent of the magnetic stack 202.

Regardless of the configuration of the magnetic shields, which may be similar or dissimilar laminations, the respective electrode laminations 208 can translate a fixed magnetization of the shields 210 and 212 to the respective free layer laminations 204 to induce default magnetizations in the free layer laminations 204. Such default magnetizations can have a predetermined strength and orientation, such as orthogonal magnetization directions angled towards the ABS, which allows for efficient magnetoresistive response to encountered data bits via scissoring of the default magnetizations. However, the reliance of free layer laminations 204 operation on accurate magnetic biasing from the adjacent magnetic shields 210 and 212 can emphasize the magnetic coupling provided by the electrode laminations 208.

In various embodiments, the electrode laminations 208 can respectively be configured with similar or dissimilar numbers of layers and materials to optimize the magnetic coupling of the shields 210 and 212 with the free layer laminations 204. The magnetic cap 222 and seed 224 laminations can each functionally act as part of the shields 210 and 212 so as not to contribute to the shield-to-shield spacing 226 of the data sensor 200. The coupling laminations 228 may facilitate transmission of the fixed magnetization of the shields 210 and 212 to the free layer laminations 204, respectively. The tuned configuration of the coupling laminations 228 can provide optimized downstream performance and signal-to-noise ratio (SNR) for the data sensor 200.

The magnetic cap 222 and seed 224 laminations can be tuned to establish crystallographic textures that contribute to the structure and magnetic characteristics of the layers subsequently grown thereon. For example, various shield materials can have a face-centered cubic (fcc) crystallographic texture at the interface 230 between the magnetic seed lamination 224 and the coupling lamination 228 that is propagated to the free layer lamination 204 and consequently degrades the magnetoresistive response of the free layer laminations 204 to encountered data bits, irrespective of the similar or dissimilar tuned thicknesses 232 of the respective free layer laminations 204. The ability to tune the material, thickness, and number of constituent layers in the electrode laminations 208 to provide a crystallographic texture in the free layer lamination 204 that differs from the bottom shield 212 allows for precise control of magnetic coupling strength and magnetoresistive response in the magnetic stack 202 to obtain increased data bit sensing performance.

Figure 4:
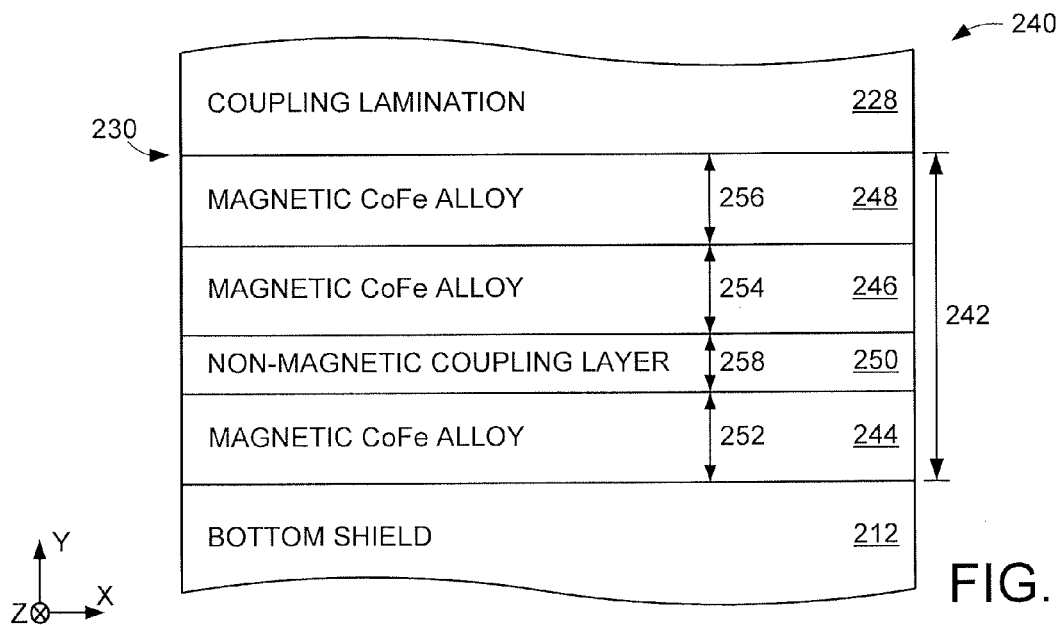
FIG. 4 shows an ABS view block representation of a portion of an example data sensor configured in accordance with some embodiments.

FIG. 4 provides an ABS view block representation of a portion of an example data sensor 240 configured in accordance with some embodiments to provide tuned crystallographic texture to a magnetic stack. In trilayer magnetic stacks, such as stack 160 of FIG. 2B, a non-magnetic transition metal, like Ru or Ta, can be used as a seed to grow the magnetically free layers with a non-fcc crystallography. It can be appreciated that such a non-magnetic seed layer would interrupt or minimize the magnetic coupling of a magnetic shield and magnetically free layer lamination. Hence, a magnetic stack seed structure capable of altering the underlying crystallographic texture of the bottom shield while promoting tuned magnetic coupling between the magnetically free layer and magnetic shield can optimize performance of the sensor 240 by refining the magnetic extent of the magnetic stack and increasing data bit resolution.

Although a single layer of material can be utilized as a magnetic seed for an ultrahigh linear density data sensor, various embodiments utilize a lamination of dissimilar materials to provide a different crystallographic texture at the interface 230 of the coupling lamination 228 and magnetic seed electrode lamination 242 than in the bottom shield 212. The non-limiting magnetic seed electrode lamination 242 of FIG. 4 has a plurality of ferromagnetic amorphous alloy sub-layers 244, 246, and 248 and a non-magnetic coupling sub-layer 250 that separates at least two of the alloy sub-layers. The insertion of the non-magnetic coupling sub-layer 250 material, which can be at least Ta, CoHf, CoZr, CoW, CoB, CoP, CoTa, CoFeTa, CoFeBTa, can serve to prevent the crystallographic texture of the bottom shield 212 from transferring to the coupling lamination 228 via the interface 230.

The ability to tune the material, thickness, and position of the assorted sub-layers of the magnetic seed electrode 242 can provide a balance of crystallographic texture, magnetic coupling, and magnetoresistive response of the magnetic stack that cannot be found with single magnetic or non-magnetic seed layers. Some embodiments tune the various alloy sub-layers 244, 246, and 248 to be dissimilar materials and thicknesses 252, 254, and 256, respectively. A non-limiting example utilizes ferromagnetic amorphous alloy sub-layer materials, like CoFeB, CoTa, CoFeTa, CoFeBTa CoFeZr, CoFeZrTa, and CoFeHf, with 5-15 Å thicknesses while the coupling sub-layer has a thickness 258 that ranges from 0.5-3.5 Å. Other embodiments employ more than one, but less than all, alloy sub-layers being tuned similarly to provide a predetermined crystallographic texture, such as body-centered cubic (bcc) or hexagonal close packed (hcp), at interface 230 and break-up the texture of the bottom shield 212.

It should be noted that the various constituent sub-layers of the magnetic seed electrode lamination 242 may be deposited separately, but may be form a unitary amalgamation after manufacturing steps like annealing. That is, the uniform thickness and materials of the various magnetic seed sub-layers in FIG. 4 are as-deposited and may not be separate or distinguishable as different sub-layers subsequent to manufacturing, testing, and operating conditions that vary the heat, electrical current, and magnetic flux flowing through the seed electrode lamination 242. However, the presence of the constituent sub-layer materials and thicknesses can be ascertained by comparing the crystallographic texture and magnetic coupling characteristics of a tuned magnetic seed lamination to a different seed structure, such as a structure comprising a single layer of a single material.

Figure 5:
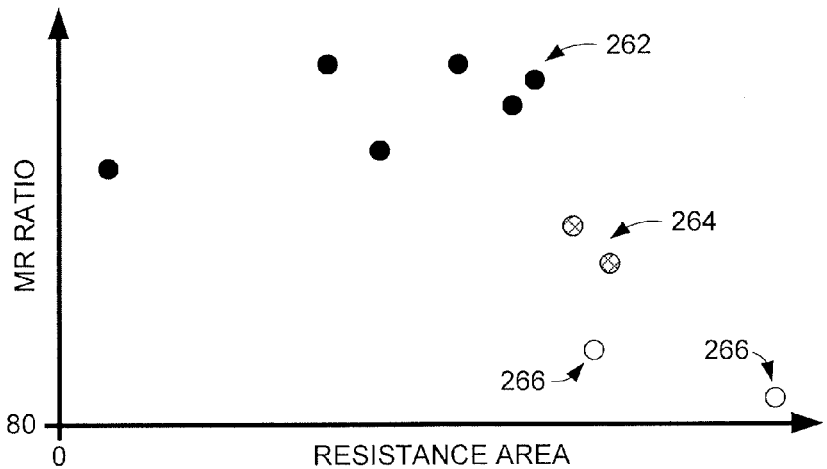
FIG. 5 plots various operational and structural characteristics of an example data sensor constructed an operated in accordance with various embodiments.

Through the tuned configuration of the magnetic seed electrode lamination 242, a magnetically free layer lamination can be formed with a predetermined crystallographic structure that promotes high magnetoresistive ratios and stable default magnetizations via coupling with the adjacent magnetic shield. FIG. 5 plots the magnetoresistive ratio of various data sensors employing differently tuned magnetic seed laminations. Solid circles 262 correspond to a 25 Å thick CoFeB amorphous alloy sub-layer with a less than 1 Å dusting of Ta deposited thereon and a Ta coupling sub-layer.

The patterned circles 264 illustrate the magnetoresistive ratio and resistance area for a stack having a CoFeB alloy sub-layer without a Ta coupling layer or dusting. For contrast, open circles 266 correspond to a magnetic seed lamination constructed with a NiFe magnetic seed material and without a Ta coupling layer or dusting. The high magnetoresistive ratio available in a small resistive area magnetic stack for magnetic seed laminations employing a Ta coupling layer illustrates how tuning the constituent sub-layers of a magnetic seed lamination can optimize magnetic stack operation for use in reduced form factor, high areal data bit density data storage environments. However, additional data sensor tuning can be conducted to further optimize the magnetic stability and data bit reading performance.

Figure 6:
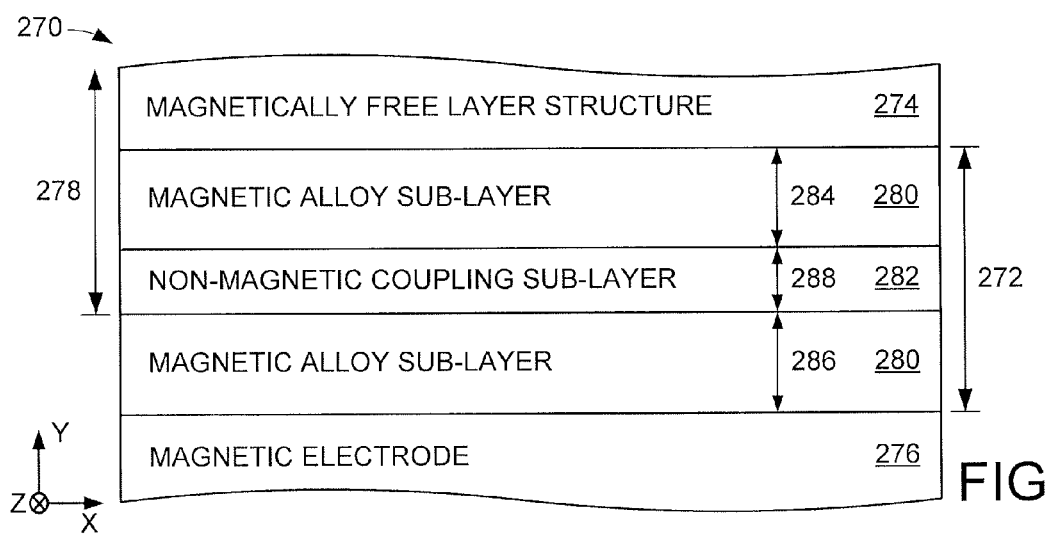
FIG. 6 illustrates an ABS view block representation of a portion of an example magnetic element capable of being utilized in the data sensor of FIG. 3.

FIG. 6 displays an ABS view block representation of a portion of an example data sensor 270 capable of being constructed and operated in accordance with various embodiments. The data sensor 270 is configured with a coupling lamination 272 contactingly disposed between a magnetically free structure 274 and magnetic electrode 276. The coupling lamination may, in assorted embodiments, be non-magnetic and contribute to the shield-to-shield spacing 278 of an adjacent magnetic stack. In order to control the coupling energy between the magnetically free structure 276 and an adjacent magnetic shield via the magnetic electrode 276, the coupling lamination 272 can have multiple magnetic alloy sub-layers 280 separated by a non-magnetic coupling sub-layer 282.

While not required or limiting, the material and thicknesses of the various coupling lamination sub-layers can be tuned to produce RKKY coupling with optimized data bit sensitivity conducive to accurate resolution in ultrahigh linear data bit density environments. For example, Co or a CoFe alloy can be utilized to construct the magnetic alloy sub-layers 280 with similar or dissimilar thicknesses 284 and 286 can be complemented by the similar or dissimilar thickness 288 of the coupling sub-layer 282 to control the coupling strength between the free structure 274 and the electrode 276. It is contemplated that configuring the free structure 274 of a CoFe alloy, like CoFeB, that contacts a non-magnetic coupling layer can degrade coupling strength and jeopardize linear density resolution for the data sensor 270. Hence, the insertion of magnetic Co or CoFe alloy sub-layers 280 can optimize the coupling strength of the coupling lamination 272 and promote increased data bit sensitivity.

Figure 7:
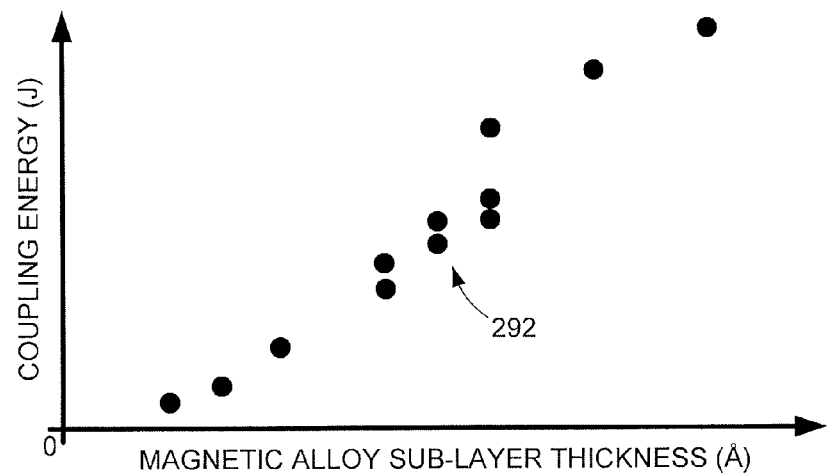
FIG. 7 provides various data corresponding to an example data sensor tuned in accordance with various embodiments.

FIG. 7 illustrates how tuned magnetic alloy sub-layer thickness can produce a variety of coupling strengths that can be utilized to optimize data sensor structure and operation. As shown, solid circles 292 correspond to various alloy sub-layer thicknesses, such as thicknesses 284 and 286 of FIG. 6, and the resulting operational coupling energy produced therefrom. The ability to tune the thickness of the magnetic alloy sub-layers of a coupling lamination can allow a data sensor to be tailored to assorted data bit densities.

In other words, the presence of greater data bit density can provide higher amounts of stray magnetic fields that can jeopardize magnetic stability in a dual free layer magnetic stack. The ability to utilize various magnetic alloy sub-layer materials and thicknesses can tune the magnetic coupling strength of a coupling lamination to maintain magnetic stability in a dual free layer magnetic stack despite elevated levels of stray magnetic fields. Additionally, the ability to tune the alloy sub-layers to be different thicknesses, as measured along the Y axis and parallel to the ABS, can reduce the shield-to-shield spacing 278 of the data sensor 270 while having more robust magnetic coupling strength.

Figure 8:
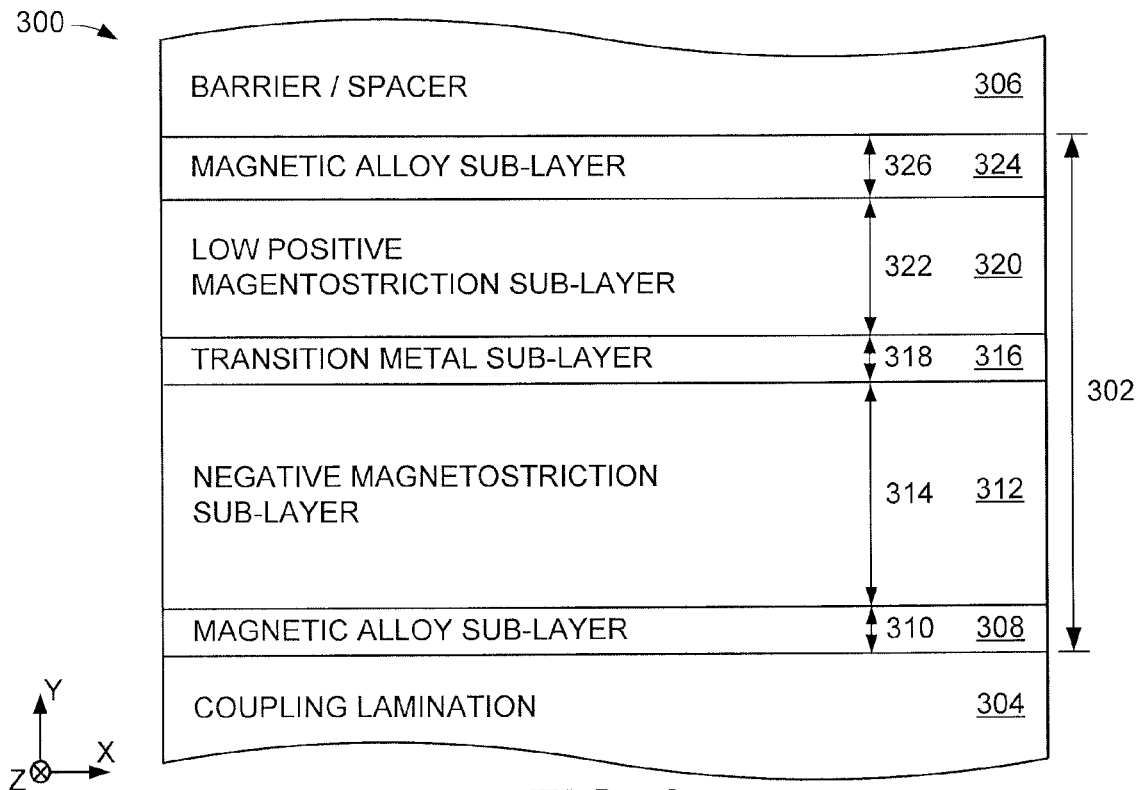
FIG. 8 displays an ABS view block representation of a portion of an example data sensor configured in accordance with some embodiments.

The tuned configuration of a magnetic seed lamination, as shown in FIG. 4, and coupling lamination, as shown in FIG. 6, may be utilized individually and collectively to increase data bit resolution and magnetic stability. Various embodiments complement the tuned seed and coupling laminations by constructing the magnetically free structure of a dual free layer data sensor as a lamination of dissimilar materials. FIG. 8 displays an ABS view block representation of a portion of an example data sensor 300 constructed in accordance with some embodiments. The data sensor 300 is configured with a magnetically free lamination 302 disposed between a coupling lamination 304 and a barrier or spacer layer 306. It is contemplated that a data sensor can have multiple free laminations that are similarly or dissimilarly configured and separated by the barrier/spacer layer 306 to produce a dual free layer data sensing magnetic stack.

It is contemplated that the use of a single free layer material, such as CoFeB, can induce large amounts of magnetostriction into the magnetic stack, which can be a source of magnetic instability in relation to thermal-mechanical stresses. That is, relatively high magnetostriction materials can be unstable and decrease magnetic performance of a magnetic stack that does not have a fixed magnetization integrated into the magnetic stack. Accordingly, multiple dissimilar sub-layers can form the free lamination 302 with reduced magnetostriction that corresponds with optimized magnetoresistance.

Although various embodiments can configure a free lamination with an unlimited variety of materials, the non-limiting embodiment of FIG. 8 illustrates how a magnetic alloy sub-layer 308 can have a first thickness 310 and contact a negative magnetostriction sub-layer 312 having a second thickness 314 that is greater than the first thickness 310. The negative magnetostriction sub-layer 312 can comprise Ni, NiFe alloys, Co, and CoB alloys with a thickness 314 ranging from 20-40 Å to reduce the aggregate magnetostriction of the free lamination 302. A non-magnetic transition metal sub-layer 316, such as Ru or Ta, that has a third thickness 318 can be positioned between the negative magnetostriction sub-layer 312 and a low positive magnetostriction sub-layer 320.

It is contemplated that the addition of negative magnetostriction materials can produce degraded magnetoresistance values in magnetic stacks with reduced physical sizes and resistance areas on the ABS. Hence, the addition of the low positive magnetostriction sub-layer 320 with a fourth thickness 322 that is greater than the transition metal sub-layer thickness 318 and magnetic alloy sub-layer thickness 310 can match the magnetoresistance of the data sensor 300 to a trilayer magnetic stack and provide efficient implementation into existing data storage devices. The low positive magnetostriction sub-layer 320 is constructed, in some embodiments, of CoTa or a CoFe alloy, such as CoFeTa, CoFeZr, and CoFeZrTa.

A second magnetic alloy sub-layer 324 having a fifth thickness 326 is inserted between the barrier/spacer layer 306 and the low positive magnetostriction sub-layer 320 to provide predetermined crystallographic and magnetic characteristics that increase free lamination 302 magnetoresistive response to encountered data bits. The first 308 and second 324 magnetic alloy sub-layers are configured, in some embodiments, of Co or CoFe materials that can provide predetermined magnetoresistance between free laminations of a magnetic stack.

The concurrent use of sub-layers with different magnetostrictions can allow the magnetoresistance of a dual free layer magnetic stack to be tuned to provide ultrahigh linear density data bit resolution. It should be noted that the sub-layer configuration shown in FIG. 8 is as-deposited and the materials, thicknesses, and lamination construction can be altered before and during operation. For example, the data sensor 300 may undergo one or more annealing treatments that meld the various free lamination sub-layers into a composite that has indistinguishable thicknesses, but can be distinguishable over single layer magnetically free structures by the magnetic characteristics provided by the variety of dissimilar materials.

Figure 9:
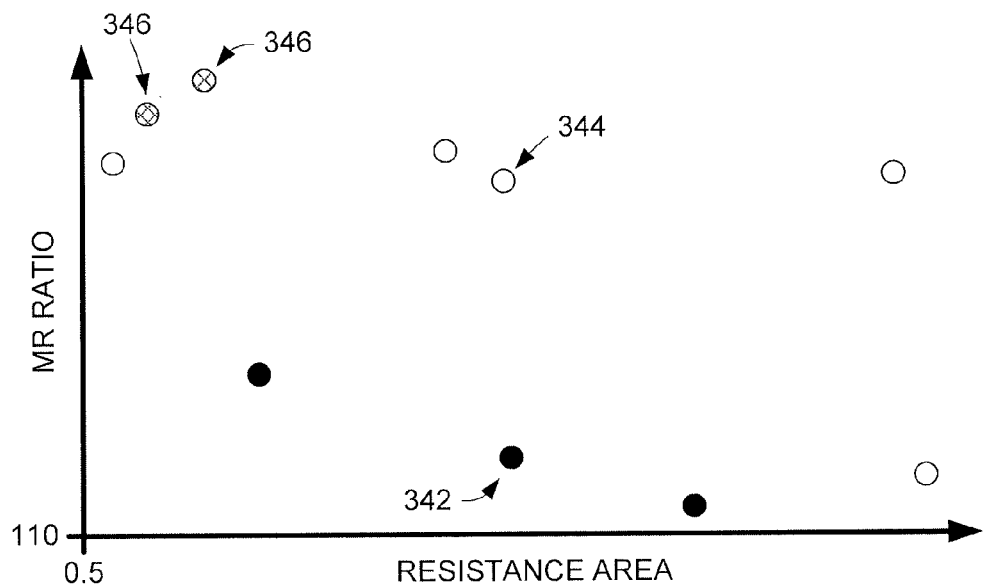
FIG. 9 plots data from various data sensors respectively tuned in accordance with assorted embodiments.

FIG. 9 plots the magnetoresistance ratio for a tuned free lamination having various physical sizes and resistance areas on an ABS. Solid circles 342 correspond to a free lamination having negative magnetostriction materials while open 344 and patterned 346 circles respectively correspond with negative and low positive magnetostrictions of differing thicknesses being utilized. The low magnetoresistance ratios for various resistance areas compared to the relatively high magnetoresistance ratios for similar resistance areas illustrates how the combination of negative and low positive magnetostriction sub-layers can optimize data bit resolution in scaled magnetic stacks.

The various data points in FIG. 9 correspond with differing sub-layer thicknesses and illustrate how the magnetoresistance of a data sensor can be tuned by altering the materials and sub-layer thicknesses of a free lamination. The reduced magnetostriction corresponding to the tuned configuration of a free lamination can operate in concert with tuned magnetic seed and coupling laminations to provide optimized magnetoresistance along with robust magnetic stability and decreased noise.

Figure 10:
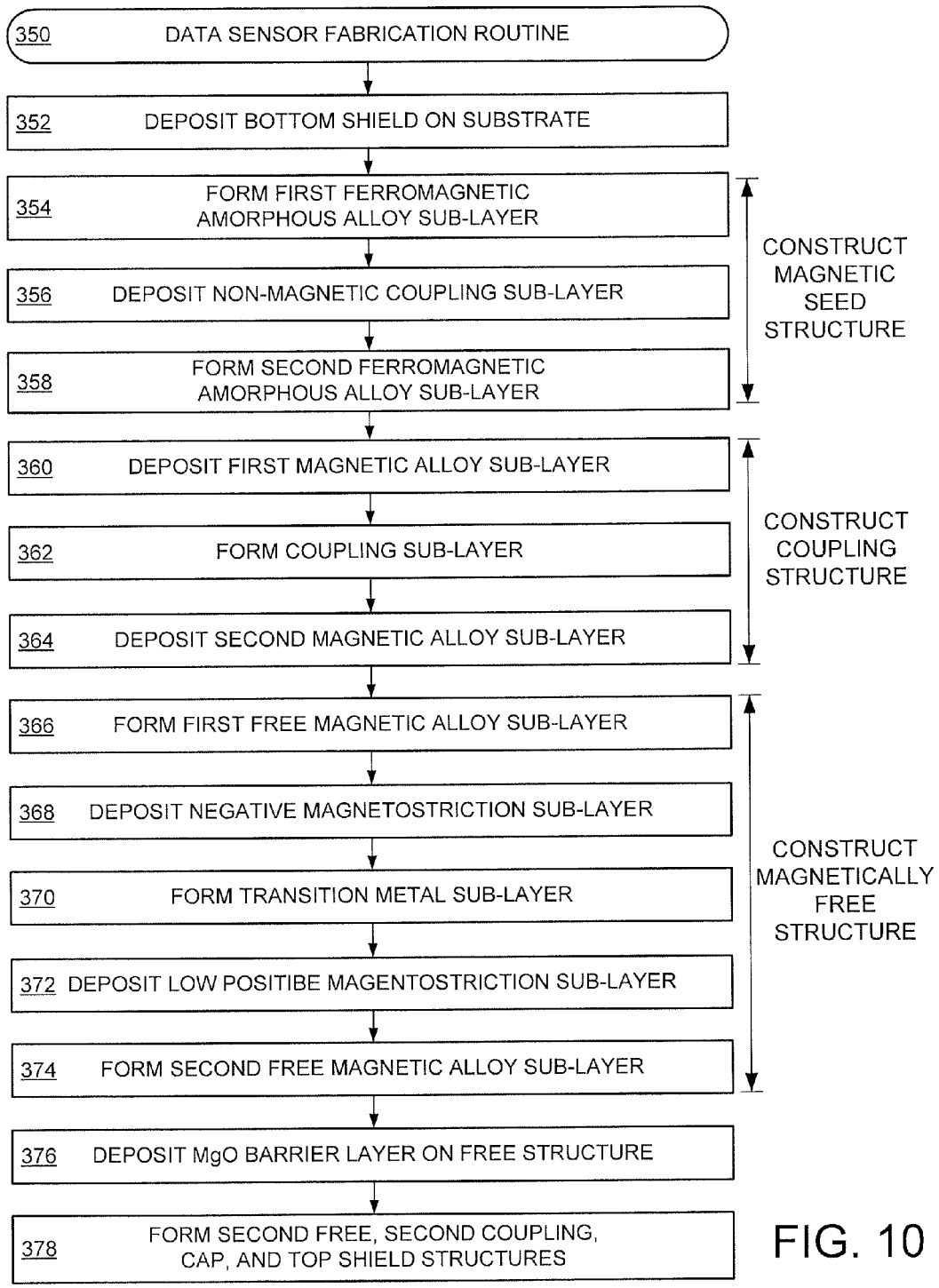
FIG. 10 provides a flowchart of an example data sensor fabrication routine carried out in accordance with various embodiments.

Although tuned magnetic seed, coupling, and free laminations can be practiced individually, various embodiments employ all three features into a common data sensor to provide ultrahigh linear data bit density resolution. FIG. 10 displays a flowchart of an example data sensor fabrication routine 350 that is utilized in various embodiments to form an ultrahigh linear data bit density data storage device. The routine 350 may begin with step 352 depositing a bottom shield on a substrate. The bottom shield may be one or more layers of soft or hard magnetic materials that form a fixed magnetization, such as a magnetization aligned parallel to the ABS. It is contemplated that step 352 may comprise the deposition of multiple layers successively with common or different deposition techniques, such as sputtering and vapor deposition.

Step 354 subsequently forms a first ferromagnetic amorphous sub-layer on the bottom shield to begin the construction of a magnetic seed lamination. Steps 356 and 358 proceed to respectively deposit a non-magnetic coupling sub-layer and second ferromagnetic amorphous sub-layer to complete the magnetic seed lamination. Steps 354, 356, and 358 may successively form layers of similar or dissimilar thicknesses to provide a predetermined crystallographic texture, such as bcc, that differs from the crystallography of the bottom shield.

Next, a coupling lamination is constructed by depositing a first magnetic alloy sub-layer on the seed lamination in step 360, a coupling sub-layer atop the first alloy sub-layer in step 362, and a second magnetic alloy sub-layer on the coupling sub-layer in step 364. As illustrated in FIGS. 6-7, the material and thicknesses of the coupling lamination sub-layers can be tuned to provide predetermined coupling strength between the bottom shield and magnetically free structure. Such tuning may further provide a RKKY coupling that increases linear data bit resolution of a data sensor without unduly increasing the shield-to-shield spacing of the data sensor.

The tuned configuration of the magnetic seed and coupling laminations can provide robust magnetic stability in the biasing of a magnetically free structure to a default magnetization via coupling with the bottom shield. However, increased magnetostriction in a magnetically free structure of a magnetic stack can degrade magnetoresistive performance of the magnetic stack, particularly in magnetic stacks with reduced physical dimensions and resistance areas. Steps 366, 368, 370, 372, and 374 respectively construct a magnetically free structure that has reduced magnetostriction and optimized magnetoresistance, which may be similar to the data sensor shown in FIG. 8. Specifically, step 366 forms a first free magnetic alloy sub-layer atop the coupling lamination.

It is contemplated that the first free magnetic alloy sub-layer will be grown in step 366 with a predetermined crystallographic orientation that differs from the bottom shield to provide optimized magnetic characteristics, like anisotropy and coercivity. A negative magnetostriction material is then deposited atop the first free magnetic alloy sub-layer in step 368 to reduce the magnetostriction of the free structure without degrading the magnetoresistance of the data sensor. Step 370 forms a non-magnetic transition metal sub-layer on the negative magnetostriction sub-layer before step 372 deposits a low positive magnetostriction material as a sub-layer atop the transition metal sub-layer.

Construction of any of the sub-layers in the free structure can be tuned for material and thickness to provide uniform and continuous films that operate with optimized magnetostriction and magnetoresistance across the MgO barrier layer deposited in step 376. Routine 350 may continue to form a second free structure, coupling structure, magnetic cap structure, and top shield structure alone or in combination in step 378. The various structures formed in step 378 can be single layers of material or laminations of multiple different sub-layers. In various embodiments, the coupling and magnetic cap structures formed in step 378 are respectively constructed to match the seed and coupling laminations formed in steps 354-364. However, other embodiments configure the magnetic cap and coupling structures in step 378 to be different materials, thicknesses, and number of layers than the seed and coupling laminations adjacent the bottom shield.

With the ability to construct magnetic seed, magnetic cap, first coupling, and second coupling laminations with sub-layers that promote optimized crystallographic texture and magnetic coupling between magnetically free structures and adjacent shields, data sensor performance can be tailored to smaller resistance area form factors. Furthermore, the ability to tune a magnetically free structure as a lamination of sub-layers having different magnetostriction can optimize data sensing performance of a data sensor. However, the various steps displayed in routine 350 are not required or limiting as any number of decisions and steps may be added, removed, and modified. For example, one or more decisions can be added to routine 350 to determine the number, material, and thickness of various sub-layers, which can be subsequently constructed with additional steps added to routine 350.

It should be noted that the term "stack" is an unlimited term within this disclosure that can be one or more vertically and horizontally aligned layers, constructed of magnetic and non-magnetic material that are capable of magnetic reading and writing. Throughout the present application, the term "stack" will be understood to mean a component that is constructed to respond to external data bits. For example, but not in any way limiting, a magnetic stack may be a data sensor that can differentiate between a plurality of data bits.

Through the diverse variety of tunable structural and operational magnetic stack characteristics, a dual free layer data sensor can be optimized for magnetic stability and ultra-high linear data bit resolution. A multi-layered magnetic seed lamination can be tuned with ferromagnetic amorphous alloy sub-layers that prevent the crystallographic texture of the bottom shield from being transferred to a free layer of the magnetic stack. A tuned coupling lamination can provide precise RKKY coupling between a magnetic shield and free layer to produce optimized magnetic stability for default magnetizations and magnetizations responsive to encountered data bits. A tuned configuration of a magnetically free layer as a lamination of sub-layers having different magnetostrictions allows for tunnel magnetoresistance (TMR) to be maintained despite reduced data sensor resistance area on the ABS.

While the embodiments herein have been directed to magnetic sensing, it will be appreciated that the claimed invention can readily be utilized in any number of other applications, including data storage device applications. It is to be understood that even though numerous characteristics of various embodiments of the present disclosure have been set forth in the foregoing description, together with details of the structure and function of various embodiments, this detailed description is illustrative only, and changes may be made in detail, especially in matters of structure and arrangements of parts within the principles of the present technology to the full extent indicated by the broad general meaning of the terms in which the appended claims are expressed. For example, the particular elements may vary depending on the particular application without departing from the spirit and scope of the present disclosure.

What is claimed is:

1. An apparatus comprising a magnetic stack disposed between first and second magnetic shields, the magnetic stack comprising a non-magnetic spacer layer disposed between first and second magnetically free laminations respectively coupled to the first and second magnetic shields via first and second electrode laminations, the first magnetically free lamination comprising a first sub-layer comprising a transition metal material and disposed between a second sub-layer comprising a negative magnetostriction material and a third sub-layer comprising a positive magnetostriction material.

2. The apparatus of claim 1, wherein the magnetic stack is configured without a fixed magnetization.

3. The apparatus of claim 1, wherein a fourth sub-layer is disposed between the non-magnetic spacer layer and the third sub-layer, a fifth sub-layer is disposed between the electrode lamination and the second sub-layer, the fourth and fifth sub-layers each being magnetic.

4. The apparatus of claim 1, wherein the first shield comprises a shield biasing layer and biased shield layer as part of an exchange coupled shield structure, the second shield comprises a shield coupling layer as part of a synthetic antiferromagnetic structure.

5. The apparatus of claim 1, wherein the second sub-layer is proximal the electrode lamination and the third sub-layer is proximal the non-magnetic spacer and distal the electrode lamination.

6. The apparatus of claim 1, wherein the negative magnetostriction material comprises one of the group of: Ni, NiFe alloy, Co, and CoB alloy.

7. The apparatus of claim 1, wherein the positive magnetostriction material comprises CoTa or a CoFe alloy.

8. The apparatus of claim 1, wherein the first, second, and third sub-layers have different thicknesses as measured parallel to a shield-to-shield spacing of the magnetic stack.

9. An apparatus comprising a magnetic stack disposed between first and second magnetic shields, the magnetic stack comprising a non-magnetic spacer layer disposed between first and second magnetically free laminations respectively coupled to the first and second magnetic shields via first and second electrode laminations, the first magnetically free lamination comprising a first sub-layer comprising a transition metal material and disposed between a second sub-layer comprising a negative magnetostriction material and a third sub-layer comprising a positive magnetostriction material, the first electrode lamination comprising a magnetic seed lamination configured to provide a different crystallographic texture at a first interface between the magnetic seed lamination and a coupling lamination than at a second interface between the magnetic seed lamination and the first shield.

10. The apparatus of claim 9, wherein the crystallographic texture at the first interface is body-centered cubic or hexagonal close packed and the crystallographic texture at the second interface is face-centered cubic.

11. The apparatus of claim 9, wherein the magnetic seed lamination comprises a non-magnetic coupling layer disposed between first and second seed sub-layers, the first and second seed sub-layers each being magnetic.

12. The apparatus of claim 11, wherein a third seed sub-layer is positioned between the second seed sub-layer and the coupling lamination, the third sub-layer being magnetic and the first interface being present on the third seed sub-layer.

13. The apparatus of claim 12, wherein the first, second, and third seed sub-layers are each different materials.

14. The apparatus of claim 12, wherein the first, second and third seed sub-layers respectively comprise one of the group of: CoFeB, CoTa, CoFeTa, CoFeBTa, CoFeZr, CoFeZrTa, and CoFeHf.

15. The apparatus of claim 11, wherein the non-magnetic coupling layer comprises one of the group of: Ta, CoHf, CoZr, CoW, CoB, CoP, CoTa, CoFeTa, and CoFeBTa.

16. An apparatus comprising a magnetic stack disposed between first and second magnetic shields, the magnetic stack comprising a non-magnetic spacer layer disposed between first and second magnetically free laminations respectively coupled to the first and second magnetic shields via first and second electrode laminations, the first magnetically free lamination comprising a first sub-layer comprising a transition metal material and disposed between a second sub-layer comprising a negative magnetostriction material and a third sub-layer comprising a positive magnetostriction material, the electrode lamination comprising a coupling lamination comprising a non-magnetic coupling sub-layer disposed between first and second coupling sub-layers configured to provide RKKY coupling between the first shield and the first free lamination.

17. The apparatus of claim 16, wherein the first and second coupling sub-layers comprise different magnetic materials.

18. The apparatus of claim 16, wherein the first and second coupling sub-layers each comprise a Co or CoFe alloy material.

19. The apparatus of claim 16, wherein the non-magnetic coupling sub-layer, first coupling sub-layer, and second coupling sub-layer have different thicknesses as measured along a shield-to-shield distance of the magnetic stack.

20. The apparatus of claim 19, wherein the first coupling sub-layer is excluded from the shield-to-shield distance of the magnetic stack.

* * * * *